US006775807B2

(12) United States Patent
Lowther et al.

(10) Patent No.: US 6,775,807 B2
(45) Date of Patent: Aug. 10, 2004

(54) NUMERICALLY MODELING INDUCTIVE CIRCUIT ELEMENTS

(75) Inventors: Rex Lowther, Palm Bay, FL (US); Yiqun Lin, Melbourne, FL (US)

(73) Assignee: Intersil Americas Inc., Milpitas, CA (US)

( * ) Notice: Subject to any disclaimer, the term of this patent is extended or adjusted under 35 U.S.C. 154(b) by 88 days.

(21) Appl. No.: 10/224,170

(22) Filed: Aug. 19, 2002

(65) Prior Publication Data

US 2004/0034837 A1 Feb. 19, 2004

(51) Int. Cl.[7] .......................... G06F 17/50; G06F 17/10
(52) U.S. Cl. .................. 716/1; 716/18; 703/2
(58) Field of Search ........................ 716/1, 18; 703/2–4

(56) References Cited

U.S. PATENT DOCUMENTS 3,723,718 A * 3/1973 Jaffe et al. ...................... 703/4
5,488,566 A * 1/1996 Woolsey ........................ 716/1
6,460,165 B1 * 10/2002 Ismail et al. ................... 716/18

OTHER PUBLICATIONS

"Numerical Recipes", Press, William, et. al, Cambridge University Press, 1986, reprinted [twice] 1987, Chapter 2.11, pp. 74–76.
Analsis, Design, and Optimization of Sprial Inductors and transformers fo Si Rf IC's IEEE Journal of solid State Circuits, vol. 33, 10, pp 1470–1481 Oct. 1998.

* cited by examiner

Primary Examiner—A. M. Thompson
Assistant Examiner—Paul Dinh
(74) Attorney, Agent, or Firm—Fogg and Associates, LLC; Scott V. Lundberg

(57) ABSTRACT

A method of determining electrical parameters of inductive elements includes a novel technique of inverting an impedance matrix representative of said inductive circuit element. The method reduces model simulation time by a factor of 3000. In one embodiment, simulation time of a device model was reduced from 1 hour to less than 3 seconds. The method is suitable for use with circuit element modeling tools, circuit simulation environments, and antenna modeling systems. The method may be applied to inductors, transformers, antennas, etc.

14 Claims, 8 Drawing Sheets

Where $R^f$ is a diagonal filament resistance matrix, $L^f$ is a filament inductance matrix, both $R^f$ and $L^f$ are submatrices of $Z^f$, $\omega$ is radian frequency and $[\,]^{-1}$ indicates matrix inversion.

Where $R^f$ is a diagonal filament resistance matrix, $L^f$ is a filament inductance matrix, both $R^f$ and $L^f$ are submatrices of $Z^f$, $\omega$ is radian frequency and $[\,]^{-1}$ indicates matrix inversion.

Where $R^f$ is a diagonal filament resistance matrix, $L^f$ is a filament inductance matrix, both $R^f$ and $L^f$ are submatrices of $Z^f$, $\omega$ is radian frequency and $[\,]^{-1}$ indicates matrix inversion.

NUMERICALLY MODELING INDUCTIVE CIRCUIT ELEMENTS

FIELD OF THE INVENTION

This invention generally relates to modeling or analyzing electrical circuit elements such as inductors and/or transformers so that their electrical characteristics and/or equivalent circuit parameters may be determined. The invention herein also relates to simulating the performance of electronic circuits incorporating such elements. Further, the invention relates to modeling inductors and/or transformers using a computer aided design system to facilitate design of practical elements and electronic circuits.

BACKGROUND OF THE INVENTION

Software tools for electrical engineering use may be grouped into categories according to function. Two categories are 1) circuit element modeling tools and 2) circuit design and simulation tools. Circuit element modeling tools are used to characterize a particular circuit element and create a software model for subsequent use in a circuit design and simulation program.

A model is a mathematical representation (or other type of representation) of a real world physical device (RWPD) that predicts the behavior of the real world physical device when provided with a controlled set of inputs.

Two types of models used in engineering are analytical models and numerical models. Analytical models are mathematical representations of RWPDs where a limited set of equations are used to represent a RWPD. Numerical models generally attempt to represent RWPDs by solving a more fundamental, or more physical set of equations. This often requires the solution of a large set of simultaneous equations which are restatements of a fundamental equation at different spatial or time coordinates. It will be sufficient to define a numerical model as one that requires the solution of many simultaneous equations, many more than analytical models use.

Modeling is the process of creating a model that is representative of the structure, behavior, operation, or other property of a real world physical device. Models may have other models as components, e.g. circuit models may have circuit element models.

Modeling tools use a variety of techniques to arrive at a model for a particular element, often called a device model. For example, an inductor can be modeled using commercially available software that provides a user with element parameters such as inductance and resistance for a particular geometry of the element. The modeling software can also provide element parameters over frequency in a variety of graphic or tabular formats.

Once a model is created for a circuit element, a circuit designer uses the device model in a circuit design and simulation tool, where the model is combined with other circuit element models (other device models) to form a complete circuit model. The complete circuit is then simulated using the simulation tool. The simulation tool provides a designer with circuit performance data.

Circuit designers need access to fast circuit design/simulation tools due to the iterative nature of the design process and short design cycles. Current circuit simulations often take hours or more to run. However, the preprocessing stage for the individual components, or RWPDs, usually takes much less time because less accurate analytic models are used in the interest of saving time. The time spent preprocessing is important, as this is time that the circuit designer must sit and wait at his/her terminal. To compete, the more accurate, and hence more desirable, numerical models must take no more than mere seconds, or occasionally, minutes to run. A variety of closed-form analytic models for on-chip inductors (spiral, square, etc.) can be found for the inductance, series resistance, capacitances and substrate coupling of the inductors. Since these models are only approximate models, they must be fitted (tuned) to correlate with measured data of the RWPD that spans the entire design space (the range of design variables used in the model) in order to validate and verify the model.

Model validation/verification is essentially the process of determining the degree of similarity between the model and the RWPD via comparison of measurements of the RWPD with simulation results to the same set of known(and controlled) inputs.

Factors contributing to the difficulty of this tuning process include a large variety of device types for a given circuit element (for example, inductive elements include inductors, center-tapped inductors, transformers, baluns, etc.), a broad range of parameters (design space), and widely varying process technologies. For example, in order to maximize the quality factor Q, of an inductor, the conductor line width (w) and thickness (t) become so large, one cannot make the assumption that the current density in the conductor is uniform. This non-uniform current density, (partly due to skin and/or proximity phenomena), has the effect of lowering the inductance of an inductive element by a small but often significant amount, especially in high frequency applications. Further, the non-uniform current density also has the effect of increasing the AC resistance of the inductive element. All these parameters, w, t, Q, inductance, current density, AC resistance, and more, exacerbate the modeling/tuning process.

A model created for predicting the characteristics of a circuit element should be as accurate as possible (robust). If a circuit element is not properly modeled, and a circuit is designed using that model, the circuit may not meet specifications, or perhaps, not function at all.

To further tax the robustness of analytic models, technologies using two layers of thick metal for inductors and transformers are now being considered. For example, the skin effect in a two layer, thick-metal process is more complex to model because the current in each layer will tend to crowd toward only one surface (the surface farthest from the other layer) instead of both top and bottom surfaces as in a single-layer-thick-metal process.

One motivation for desiring to employ numerical models in circuit simulation and circuit element characterization is the high level of robustness and accuracy over the entire design space that can be achieved, which is often within about 1%.

However, it is well known that numerical modeling of circuits and/or circuit elements is too slow to be of practical use in a circuit design environment. In fact, a detailed numerical model of a circuit element takes a computer many hours to obtain a solution. Long solution times are often the result of having to solve a large matrix equation. Further, many matrix operations, such as inverting a large matrix, take a very long time for even a computer to perform. Very powerful, fast computers are available to perform such calculations at a quicker pace, but they are prohibitively expensive to put on every circuit designer's desk, or even to put one in every design center.

SUMMARY OF THE INVENTION

To solve the aforementioned problems and others, it is desirable to have an accurate numerical model for inductive circuit elements contained within a circuit design environment such that it is fast enough that the circuit simulation setup time is not significantly increased, or preferably, not increased at all.

Embodiments of the invention herein include numerical modeling methods that reduces prior art device model simulation time by as much as a factor of about 3000 when simulating inductive circuit elements. Accuracies of about 1% may be achieved in as little time as about a second for a single frequency point using embodiments of the present invention.

One concept of embodiments of the present invention herein, is the applicant's recognition that the impedance matrix for an inductive circuit element has certain unique characteristics that in turn allow Strassen's method of inverting a matrix to be applied to the impedance matrix for an inductive element.

Further, Strassen's method to invert a matrix is modified such that not all of Strassen's steps need be performed to successfully invert the impedance matrix for an inductive circuit element, including, but not limited to, circular and square spiral inductors.

Another concept of the inventive method herein is to recognize that the geometry of some inductive elements are highly symmetric about a horizontal plane, thereby allowing the number of equations to be solved to be reduced by a factor of two. This is possible in these cases because the current distribution in one half of the structure is substantially the same as the current distribution in the other half of the structure that is on the other side of the plane of symmetry. Consequently, the current distribution in the entire structure may be calculated by solving a system of equations (e.g. matrix equation) with only half the number of unknowns to obtain the total inductance and resistance.

The applicant also recognizes conductors often have non-uniform current densities, such as when the skin effect is prominent at higher frequencies. This phenomenon is exploited by embodiments of the invention herein by reducing the number of equations to be solved. This is accomplished by dividing the inductive circuit element into many individual sections, where the sections in the center are larger than the sections at the edges of the conductor where the current is more concentrated and variable due to factors such as skin effect and/or proximity effects.

The overall reduction in modeling time resulting from the inventive methods herein, while still providing very high accuracy, enables circuit element (device)modeling capability to be provided within the same tool as circuit simulation software without suffering long solution times.

Using embodiments of the invention herein a circuit designer may now investigate secondary effects that have been modeled previously only by modelers using different simulation tools outside the circuit design-simulation environment. For example, the effects of variable-width spiral inductors, the effect of placing an AC bias on the inside inductor lead, or on the outside inductor lead, may now be analyzed directly by the circuit designer. Another example is the effect of continuous vias between two layers of metal used in parallel.

Secondly, tuning (tuning is the process of adjusting parameter values to make the model agree with measurements of a RWPD) to a new process would be nearly, and in some cases, totally eliminated.

Model simulation time of a particular RWPD using an embodiment of the invention herein, was reduced from 1 hour to less than 3 seconds, an overall savings in computational time of >99.9%.

It is an object of embodiments of the present invention to provide a method of very quickly inverting an impedance matrix representative of an inductive element, or group of elements.

It is another object of embodiments of the present invention to provide a method of very quickly inverting an impedance matrix representative of an inductive element, where the method is embodied in a circuit element modeling tool.

It is another object of embodiments of the present invention to provide a method of very quickly inverting an impedance matrix representative of an inductive element where the method is a modified and shortened version of Strassens's method.

It is another object of embodiments of the present invention to provide a method of very quickly inverting an impedance matrix representative of an inductive element, where the method is embodied in a circuit simulation tool.

It is another object of embodiments of the present invention to provide a circuit simulation tool that aids an operator in modeling an inductive circuit element, and further, aids an operator in simulating a circuit using the inventive numerical model.

This and other advantages and uses of the invention herein will be apparent to one of ordinary skill in the art upon reading the teaching herein.

DETAILED DESCRIPTION OF THE INVENTION

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. It has proven convenient at times, principally for reasons of common usage, to refer to these signals as bits, values, elements, symbols, characters, terms, numbers, or the like. It should be born in mind, however, that all of these and similar terms are associated with the appropriate physical quantities and are merely convenient labels applied to these quantities. Unless specifically stated otherwise as apparent from the following discussions, it is appreciated that throughout the present invention, discussions utilizing terms such as processing, computing, calculating, determining, displaying, or the like refer to the action and processes of a computer system or similar electronic computing device that manipulates and transforms data represented as physical quantities within the computer registers and memories into data similarly represented as physical quantities within the computer system memories or registers.

Figure 1:
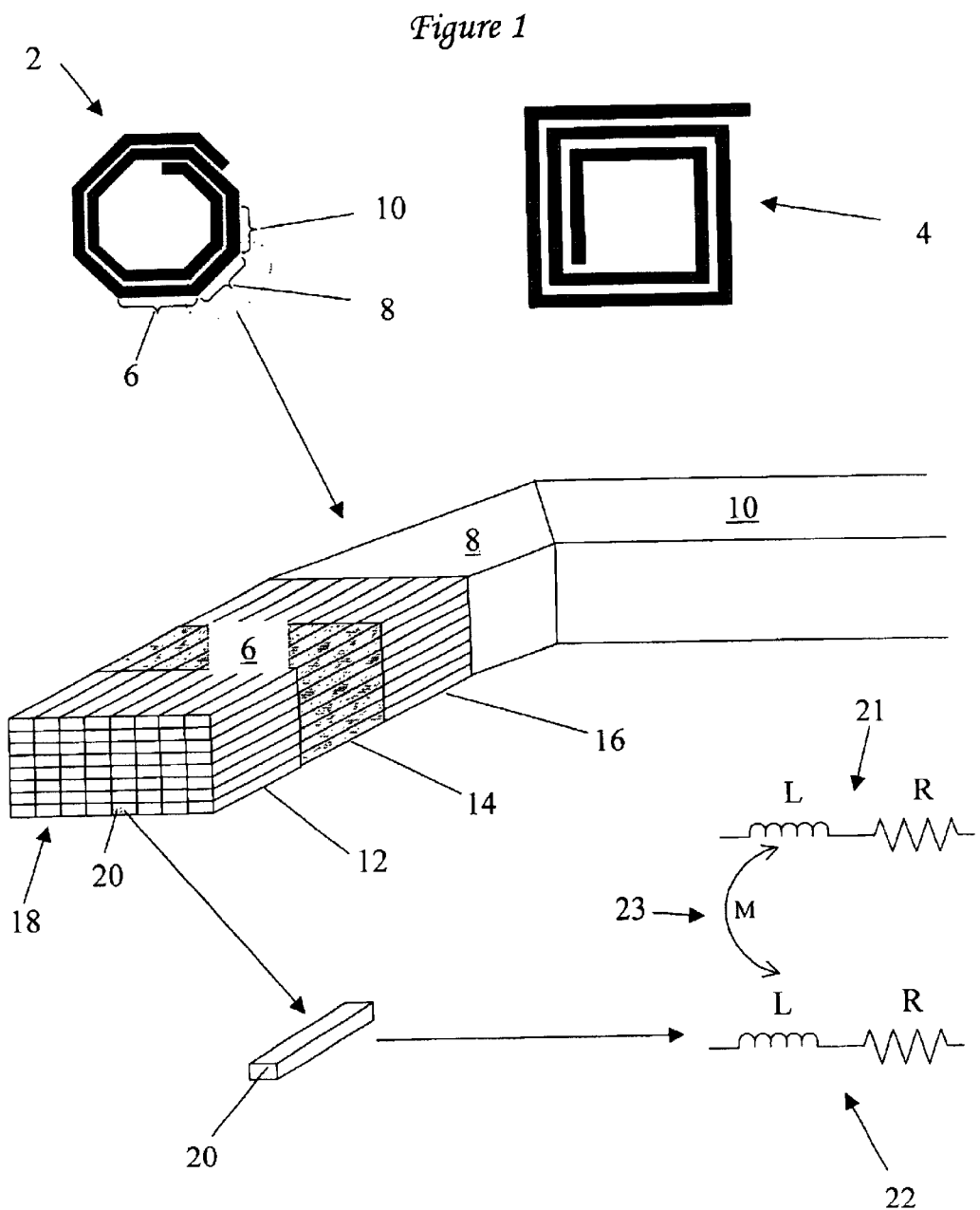
FIG. 1 shows two of many embodiments of inductive elements suitable for modeling and how inductive elements are discretized into smaller, individual filaments in accordance with embodiments by the invention herein.
Figure 4:
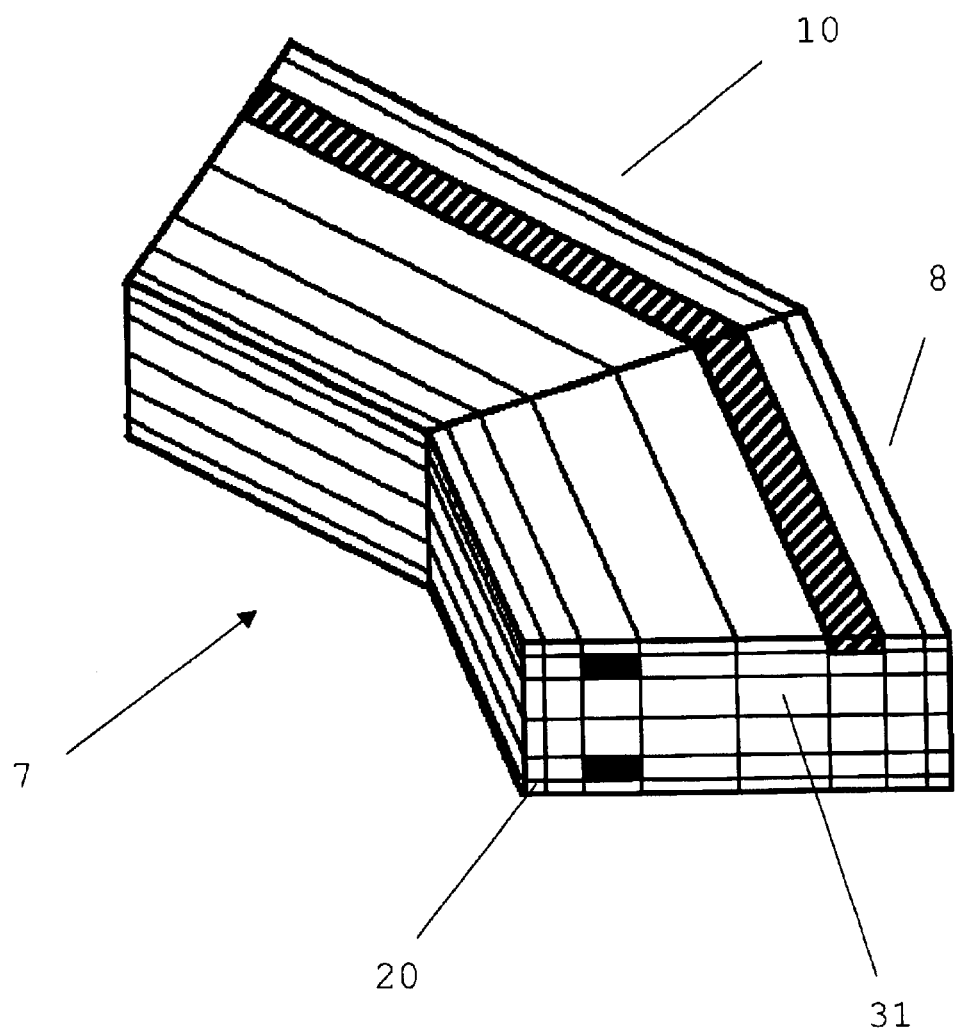
FIG. 4 shows alternate embodiments of the invention of FIGS. 1 and 3.

Inductors, such as the two non-limiting types, 2, and 4 shown in FIG. 1, are suitable candidates to be modeled using embodiments of the invention herein. Inductor 2 (or alternatively, inductor 4) is first numerically discretized into 1 or more individual segments. Referring to the example in FIG. 1, inductor 2 is discretized into a plurality of segments, only some of which are shown at 6, 8, and 10. The segments, such as segment 6, may be further defined into even smaller segments as shown at 12, 14, and 16. Alternatively, a single segment 7 may represent more than one section as shown in FIG. 4, or the entire inductor 2 or 4. The invention herein does not place restrictions on how and where segments may be defined on inductor 2.

Each segment, e.g. segment 12, is further divided into a plurality of longitudinal filaments 18 spanning the length of the segment 12 as shown in FIG. 1. An equivalent circuit model 22 for each filament, e.g. filament 20, is defined. A term associated with model 22 that may also be included in constructing an impedance matrix in accordance with embodiments of the invention herein is mutual inductance 23 coupling some or all of filament pairs an example of which is shown by models 21 and 22, where model 21 is representative of another one of filaments 18.

Inductor 2 is discretized into $N_{seg}$ segments and $N_{fil}$ filaments. Normally, this discretization has higher resolution than is shown in FIG. 1, with the number of filaments 18 often being as many as 5000 or more. Generally speaking, the more filaments, the more accurate the model as is known in the art. Considerations that influence the choice of the number of filaments used include current distribution in the RWPD, frequency of operation, device geometry, computational time etc.

Series resistance R, series inductance L and mutual inductances M shown at 22 in FIG. 1 are calculated, in addition to other parameters, perhaps including current and current density. This involves the solution of a circuit formulation requiring the inversion of an $N_{fil}$-by-$N_{fil}$ complex matrix, which dominates total computation time.

Since the computation time to invert a large, nonsparse matrix is approximately proportional to the cube of its size, much time can be saved by finding and using techniques that simply reduce the number of filaments 18, and hence equations, to be solved. Embodiments of the inventive method herein reduces the number of filaments 18, and hence the unknowns by recognizing that a plane of symmetry 24 exists along a horizontal plane of inductor 2 as shown in FIG. 2.

Figure 2:
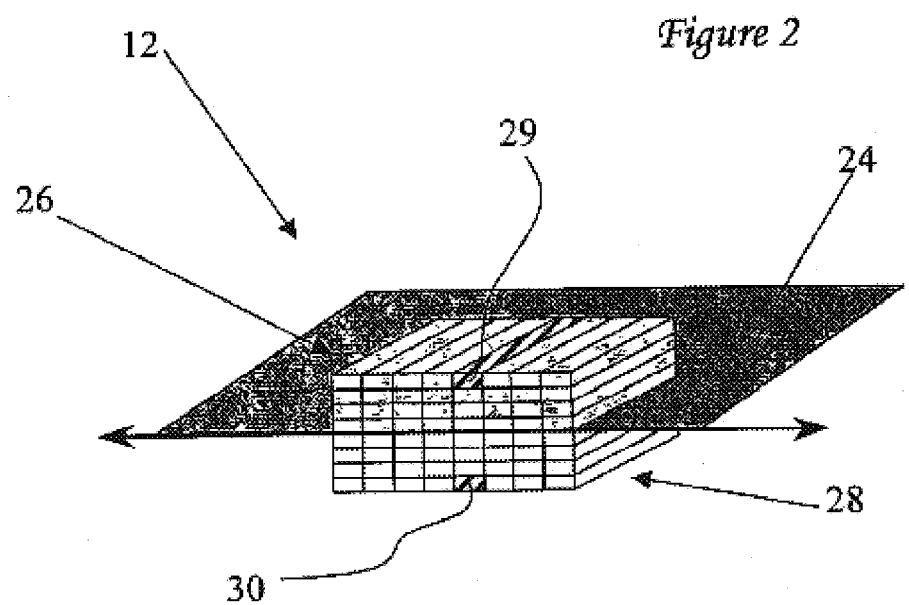
FIG. 2 shows how a plane of symmetry is used to reduce the number of equations to be solved in accordance with the invention herein.

For example, as shown in FIG. 2, symmetry about a horizontal plane 24 drawn through the center of at least segment 12 exists because the current distribution in the upper half 26 of segment 12 is essentially the same as the inverted current distribution in the lower half 28 of segment 12. Further, each filament above the horizontal plane 24 has the same current as its "partner" filament below the plane (e.g. 29, 30). Therefore there are actually half as many unknowns as filaments. This realization allows reduction of the matrix size by a factor of 2. Both conceptually and numerically, it is easiest to consider each filament pair above and below horizontal plane 24, for example, filaments 29 and 30, as a single filament.

The presence of a ground plane/die attach/paddle (not shown) may break this symmetry slightly. The effect of a paddle on inductance may be significant, but it is still small enough that the symmetry assumption is valid. This is apparent in the way that the image effect is calculated: For each filament pair 29,30, the mutual inductance of one filament to the other's image in the paddle is subtracted from the non-image mutual inductance. To maintain the symmetry in this calculation, it is sufficient to replace the vertical distance between any filament and any image filament by twice the average paddle distance (or wafer thickness). Since this distance is much larger than the metal thickness, the approximation represents a small fraction of the total effect of the paddle on inductance. For a large inductor with a 250 um span, 250 um above the paddle, the image typically reduces the total inductance by ~2%.

Figure 3:
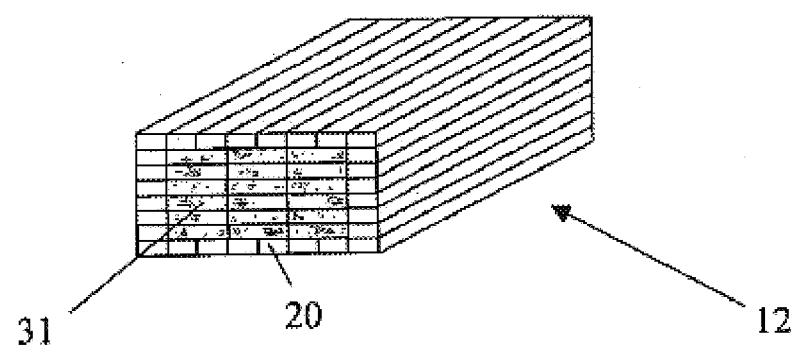
FIG. 3 shows one method of using variable size filaments to reduce the number of equations to be solved in accordance with embodiments of the invention herein.

An additional time saving technique of the inventive method herein is to grade the widths (cross-sectional area) of filaments 18 such that smaller filaments 20 are at the surfaces of the segments (where current densities are larger and more variable), and larger filaments 31 are located toward and/or at the center (see FIGS. 3 and 4). This allows $N_{fil}$ to be reduced by approximately a factor of 4 (depending on how the grading is performed) corresponding to an approximately 64-fold increase in speed.

A necessary step when modeling inductor 2 is the inversion of a filament impedance matrix, $Z^f$, obtained by explicitly writing the matrix equations for inductor 2 (after segmentation and "filamentation") using circuit model 22, and mutual inductance terms 23, as its real and imaginary parts, yielding a $2N_{fil} \times 2N_{fil}$ matrix:

$$Z^f = \begin{bmatrix} R^f & -\omega L^f \\ \omega L^f & R^f \end{bmatrix} \quad [1]$$

Where $R^f$ is a diagonal filament resistance submatrix, $L^f$ is a filament inductance submatrix, and $\omega$ is radian frequency. $L^f$ is constructed from well known formulas as is known in the art. Note, the resistance, inductance, and mutual inductance terms of model 22 are elements of the submatrices $R^f$ and $L^f$ respectively, where "f" means filament. The submatrix elements occupy positions in the impedance matrix as denoted by conventional matrix notation $a_{11}$, $a_{12}$, $a_{21}$, and $a_{22}$.

The filament impedance matrix $Z^f$ is neither symmetric nor positive-definite. Consequently, in order to directly and reliably invert $Z^f$, a full-pivoting technique costing $(2*N_{fil})^3$ operations would be required. However, according to the inventive method herein, the inverse of matrix $Z^f$ may be constructed from submatrices using a modification of a method proposed by Volker Strassen (Press, William, et. al, "Numerical Recipes", Cambridge University Press, 1986, reprinted [twice] 1987, Chapter 2.11, pages 74–76) incorporated herein by reference.

For convenience, Strassen's method is reproduced:
Defining:

$$A = \begin{bmatrix} a_{11} & a_{12} \\ a_{21} & a_{22} \end{bmatrix} \text{ and: } A^{-1} = \begin{bmatrix} c_{11} & c_{12} \\ c_{21} & c_{22} \end{bmatrix}$$

where A is a general matrix, and $A^{-1}$ is the inverse of A. Strassen devised the following eleven-step method:
Step 1: $K_1$=inverse $(a_{11})$
Step 2: $K_2=a_{21}\times K_1$
Step 3: $K_3=K_1\times a_{12}$
Step 4: $K_4=a_{21}\times K_3$
Step 5: $K_5=K_4-a_{22}$
Step 6: $K_6$=inverse $(K_5)$
Step 7: $C_{12}=K_3\times K_6$
Step 8: $C_{21}=K_6\times K_2$
Step 9: $K_7=K_3\times C_{21}$
Step 10: $c_{11}=K_1-K_7$
Step 11: $C_{22}=-K_6$ Where the "inverse" operation indicates reciprocal if the a's and/or c's are scalars. However, "inverse" means matrix inversion if the a's and/or c's are matrices. The symbol "x" indicates multiplication.

Strassen's method has not found wide spread use because it is a more complicated process than other commonly used methods such as Gaussian elimination. Strassen's method requires more software and computational overhead, and simply does not save significant time for practical sized matrices.

An inventive concept of embodiments of the present invention is the recognition that the impedance matrix $Z^f$ for inductive circuit element 2 (and inductive elements in general) has certain unique characteristics (described infra) that in turn allow Strassen's method of inverting a matrix to be beneficially applied to the impedance matrix $Z^f$ in a way that results in a dramatic savings in time. Further, the applicant also recognizes that not all of Strassen's method need be applied to matrix $Z^f$, resulting in an even more dramatic savings in computational time.

Inventive Method Step A

Note, when applying Strassen's method to equation [1], $Z^f$, the following equalities apply:
$a_{11}=a_{22}=R^f$, $a_{12}=-\omega L^f$, $a_{21}=\omega L^f$
Strassen 1. $K_1$=Inverse $(a_{11})$:
Invert Submatrix $R^f$:

$$K_1 = \frac{1}{R^f},$$

a diagonal submatrix.

Note this step requires fewer operations than Strassen's method applied to a general case matrix because R is diagonal.
Strassen 3. $K_3=K_1\times a_{12}$:
Matrix Multiply $$\frac{1}{R^f}(-1)\omega L^f = K_3$$

Note this step requires fewer operations than Strassen's method applied to a general case matrix due to the diagonality of $$\frac{1}{R^f}.$$

Strassen 4. $K_4=a_{21}\times K_3$:
Matrix Multiply $$\omega L^f \frac{1}{R^f}(-\omega L^f) = K_4$$

Note this step requires fewer operations than Strassen's method applied to a general case matrix because the resulting matrix $K_4$ is symmetric about the diagonal. Ergo, only the diagonal and all terms either above or below the diagonal need be calculated.
Strassen 5. $K_5=K_4-a_{22}$:
Matrix Subtract:

$$\left[\omega L^f \frac{1}{R^f}(-\omega L^f)\right] - R^f \xrightarrow{\text{yields}} -\omega^2 L^f \frac{1}{R^f} L^f - R^f = K_5 \qquad [2]$$

(The expression on the left may be replaced with the simplified version on the right)
Note this step requires fewer operations than Strassen's method applied to a general case matrix.
Apply Strassen 6. $K_6$=Inverse $(K_5)$, to [2] yielding:

$$M_1^f = \left[-\omega^2 L^f \frac{1}{R^f} L^f - R^f\right]^{-1} = K_6 \qquad [3]$$

and $c_{22}=-K_6$
It can be shown that:
$c_{11}=c_{22}$, and therefore $$c_{11} = c_{22} = -K_6 = -\left[\omega^2 L^f \frac{1}{R^f} L^f + R^f\right]^{-1}$$

Note this step requires fewer operations than Strassen's method applied to a general case matrix because the matrix $K_5$ is symmetric and positive definite allowing a special matrix inversion routine to be used that takes advantage of these properties.

Further, $M_1^f$ is determined by inverting a symmetric, positive-definite matrix half the size of $Z^f$, in lieu of inverting $Z^f$ directly, which, is neither symmetric nor positive-definite.

Inventive Method Step B
Apply Strassen 7. $c_{12}=K_3\times K_6$, yielding:

$$c_{12}: M_2^f = \omega \frac{1}{R^f} L^f M_1^f \qquad [4]$$

It can be shown that, $c_{21}=(-c_{12})$
Note this step requires fewer operations than Strassen's method applied to a general case matrix because the resulting matrix is symmetric about the diagonal.

Inventive Method Step C

Construct $[Z^f]^{-1}$:

$$[Z^f]^{-1} = \begin{bmatrix} c_{11} & c_{12} \\ c_{21} & c_{22} \end{bmatrix} = \begin{bmatrix} M_1^f & \omega \frac{1}{R^f} L^f M_1^f \\ -\omega \frac{1}{R^f} L^f M_1^f & M_1^f \end{bmatrix}$$

An inventive concept of embodiments of the present invention is the recognition by the applicant that steps 2, and 8–11 of Strassen's method need not be applied due to the unique properties of the impedance matrix $Z^f$ such that $a_{21}=-a_{12}$ and $a_{11}=a_{22}$ (alternatively, steps 3,7, and 9–11 may be omitted with the same result). Consequently, no additional operations are required using embodiments of the inventive method herein versus many additional operations for each of Strassen's extra steps that would have had to be performed.

Comparing dominant terms in expressions for the "number of operations" for both the invention herein and Strassen's method, it can be shown the inventive technique herein requires at least >80% fewer operations $$\left(\frac{4}{3}n^3 \text{ vs. } 7n^3\right)$$

than Strassen's method would be if applied on a general matrix and with one step of the Strassen hierarchy. This represents a significant savings in computational time when inverting the impedance matrix $Z^f$.

Comparing this method to Gaussian elimination, the inversion of $Z^f$ using this method is ~6 times faster:

$(4/3)n^3$ vs. $(2n)^3=8n^3$ operations.

Though embodiments of the inventive method herein involves two matrix multiplications, each matrix multiplication yields a symmetric matrix, of which only half the off-diagonal elements need be calculated.

Figure 5:
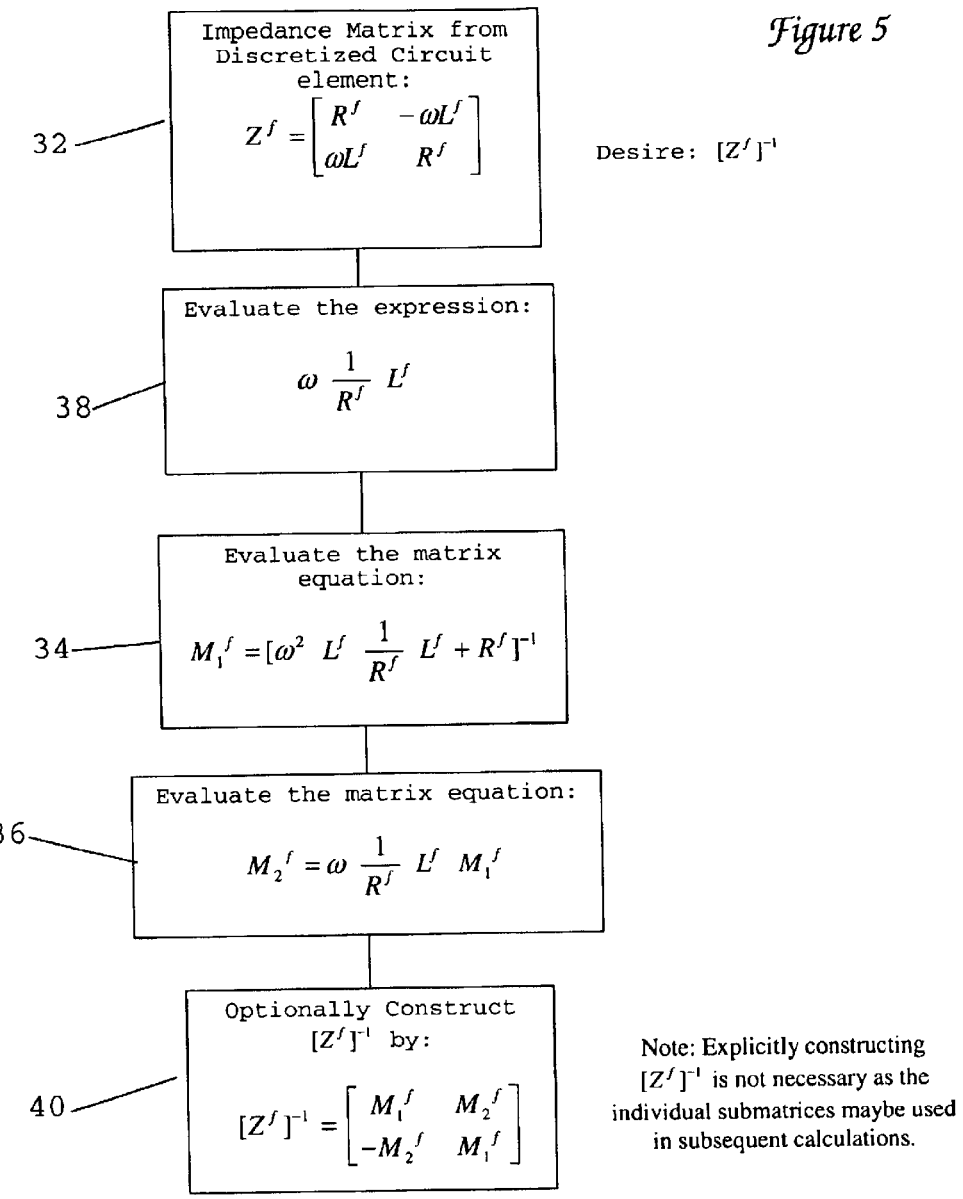
FIG. 5 shows how an impedance matrix is inverted in accordance with the invention herein.

The inventive method herein may be implemented in a software program used to model circuit elements and/or simulate circuit designs, one embodiment of which is shown in FIG. 5. Referring to FIG. 5, and after segmenting and discretizing inductor 2, an impedance matrix $Z^f$ is constructed using equivalent circuit model 22 and including the mutual inductance terms between the filaments, as shown in 32 of FIG. 5. The inverse of matrix $Z^f$ is constructed by solving the matrix equations in 34, 36, and 38 and then defining the submatrices for $[Z^f]^{-1}$ as shown in 40.

Embodiments of the inventive method herein are used to provide either a lumped-element model or an S-parameter block. An advantage of lumped-element models is that they can be faster in circuit simulation. Lumped-element models may also be created at a single frequency point and still be accurate enough at other frequencies to be useful in many circuit simulations.

S-parameter blocks can also be calculated over a range of frequencies. The calculation of S-parameter blocks may be slower than calculating a lumped-element model because the calculations have to be repeated at multiple frequencies. Additionally, S-parameter blocks may be slower in circuit simulations for the same reason, however, they are much more accurate over a wide range of frequencies. If solutions over a range of frequencies are desired for constructing S-parameter blocks, the $$L^f \frac{1}{R^f} L^f$$

term may be saved and reused at each frequency to reduce the matrix multiplications from 2 to 1 per additional frequency step. Further, an overall increase in speed by a factor of 48/5 may be achieved by evaluating the $$L^f \frac{1}{R^f} L^f$$

term outside the frequency loop.

It is understood, that although embodiments of the invention herein are described in the context of planar inductors, of which octagonal and square types are shown, embodiments of the invention are also suitable for use on transformers and other types of inductors and inductive elements (e.g. resistors, baluns, ununs, spiral inductors, symmetric inductors, on-chip interconnects, etc.) realized in different technologies such as, but not limited to planar and/or three dimensional, on-chip, on a printed circuit board, or otherwise. Embodiments of the present invention are also suitable for modeling antennas and/or antenna elements such as planar structures e.g. on-chip or Printed Circuit Board distributed structures, or non-planar structures such as wire antennas. Further, embodiments of the present invention are suitable for simulating a group of lines (e.g. conductive circuit traces) either on-chip, on a printed circuit board, or otherwise.

Figure 6:
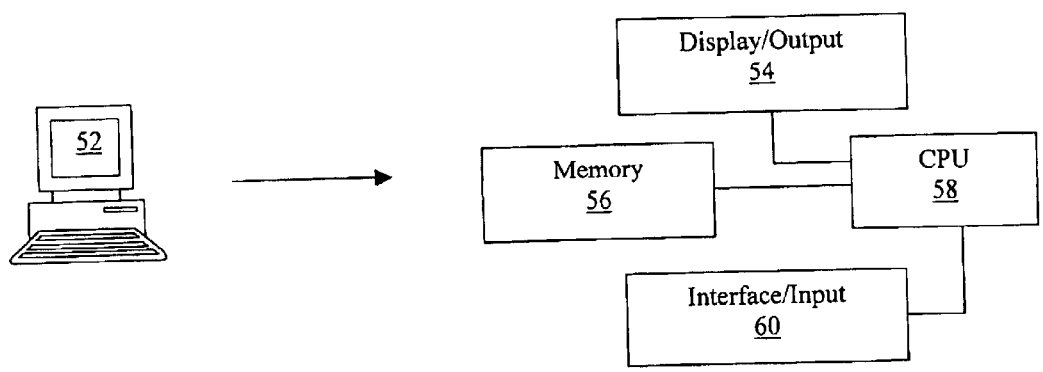
FIG. 6 shows how embodiments of the present invention may be embodied in a CAD system.

Embodiments of the present invention may be realized in a computer system such as, but not limited to, a CAD system 52 as shown in FIG. 6. System 52 includes CPU 58 for executing software (not shown) stored in memory 56. The software (or firmware) contains embodiments of the present invention. An interface 60 is provided to allow an operator to input data into the system 52, format results, and perform other well known functions associated with known modeling and/or simulation programs. A display 54 presents information to an operator such as prompts or choices to aid an operator in carrying out embodiments of the present invention, results and data formatting options as is known in the art. Display 54 may be integrated with interface 60.

Figure 7:
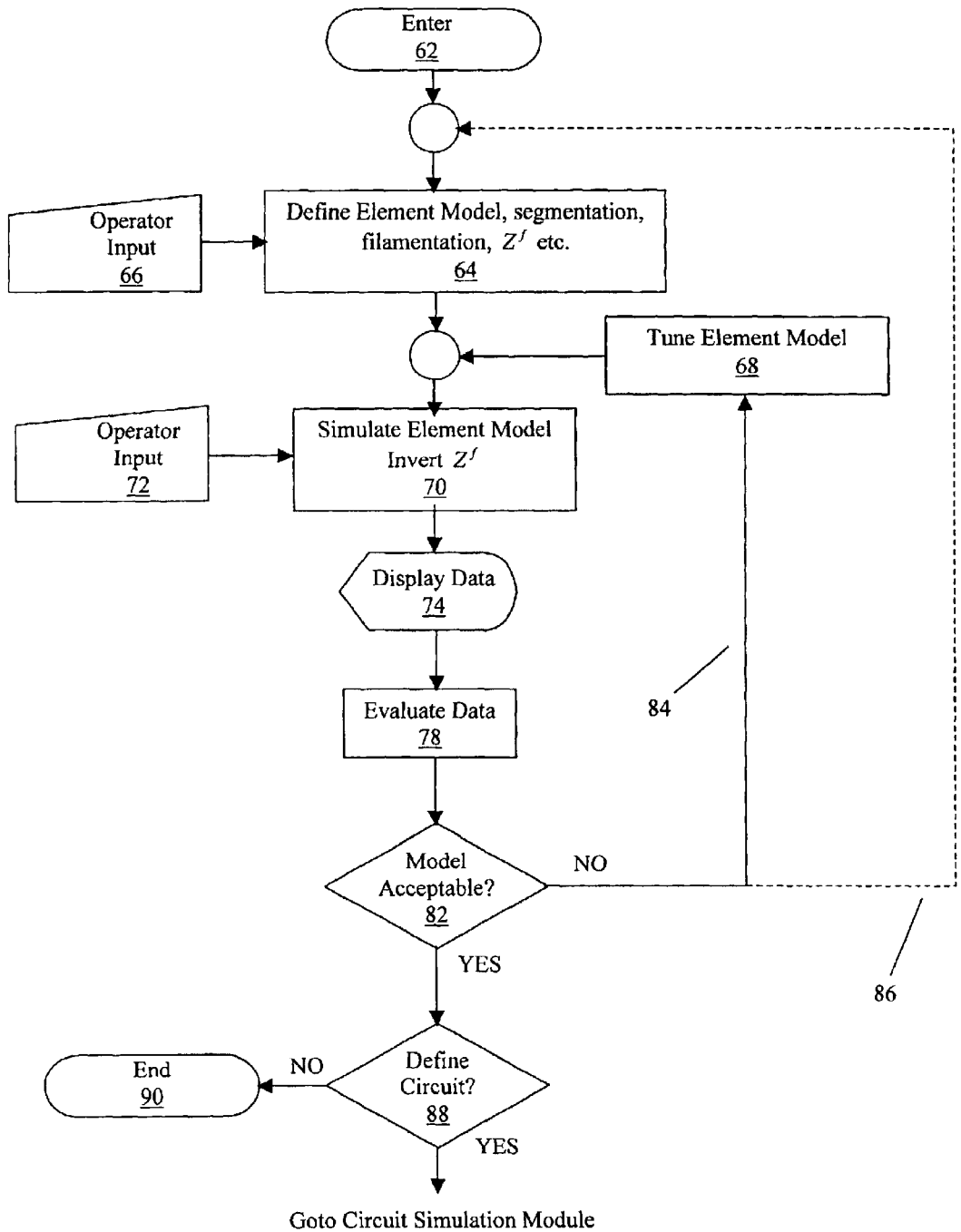
FIG. 7 shows how embodiments of the present invention may be implemented as a software module for modeling circuit elements that may be executed on the system of FIG. 6.

Embodiments of the invention may be implemented in software for modeling circuit elements as shown is FIG. 7, either as a stand alone program, or as a module (or portion) of a larger program performing other functions (such as simulating circuits). Regardless of the independence of the overall program, the module is entered via entry path 62. Parameters are defined that will be used to create an element model in process 64 as described supra, with optional input 64 from an operator (perhaps in response to a prompt from the software module). The model is simulated, evaluated and presented in steps 70–80, optionally with operator control as shown. The module either terminates, or proceeds to the next module if the model is acceptable as shown in steps 82, 88, and 90. If the model is not acceptable, then an operator has options to tune the model (path 84 and step 68) or redefine the model via path 86.

Figure 8:
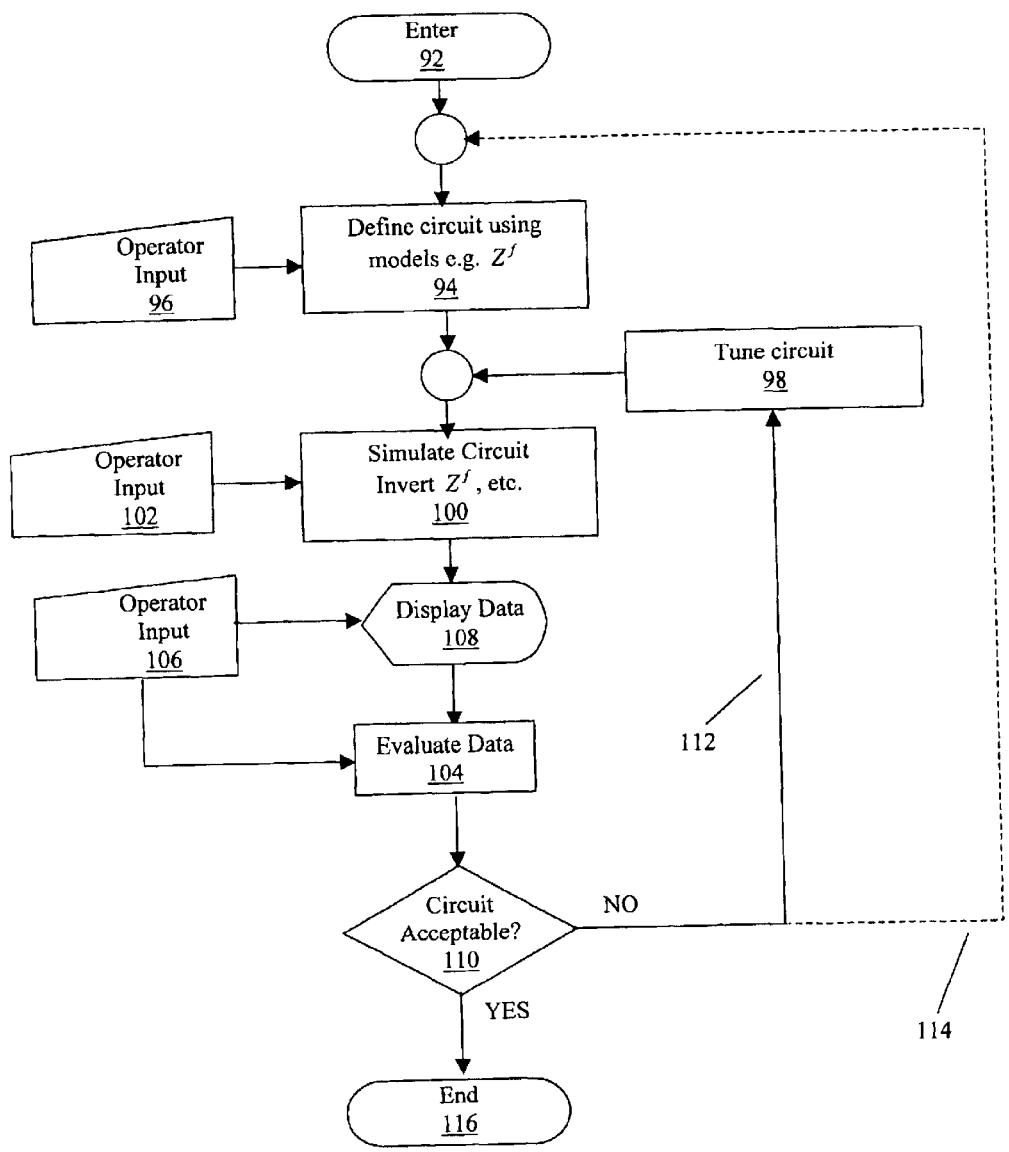
FIG. 8 shows how embodiments of the present invention may be implemented as a software module as part of a circuit simulation program that may be executed on the system of FIG. 6.

Embodiments of the invention may also be implemented in software for simulating and making circuits as shown is FIG. 8, either as a stand alone program, or as a module (or portion) of a larger program performing other functions (such as system level analysis). Regardless of the independence of the overall program, the module is entered via entry path 92. Parameters are defined that will be used to create a circuit using element models (or creating a new element model at this point) in process 94 as described supra, with optional input 96 from an operator (perhaps in response to a prompt from the software module). The circuit is simulated, data evaluated and presented in steps 100–108, optionally with operator control as shown. The module either terminates if the circuit is acceptable as shown in steps 110 and 116, or if the circuit is not acceptable, then an operator has options to tune the circuit or element model (path 112 and step 98) or redefine the circuit (or element model) via path 114.

Figure 5A:
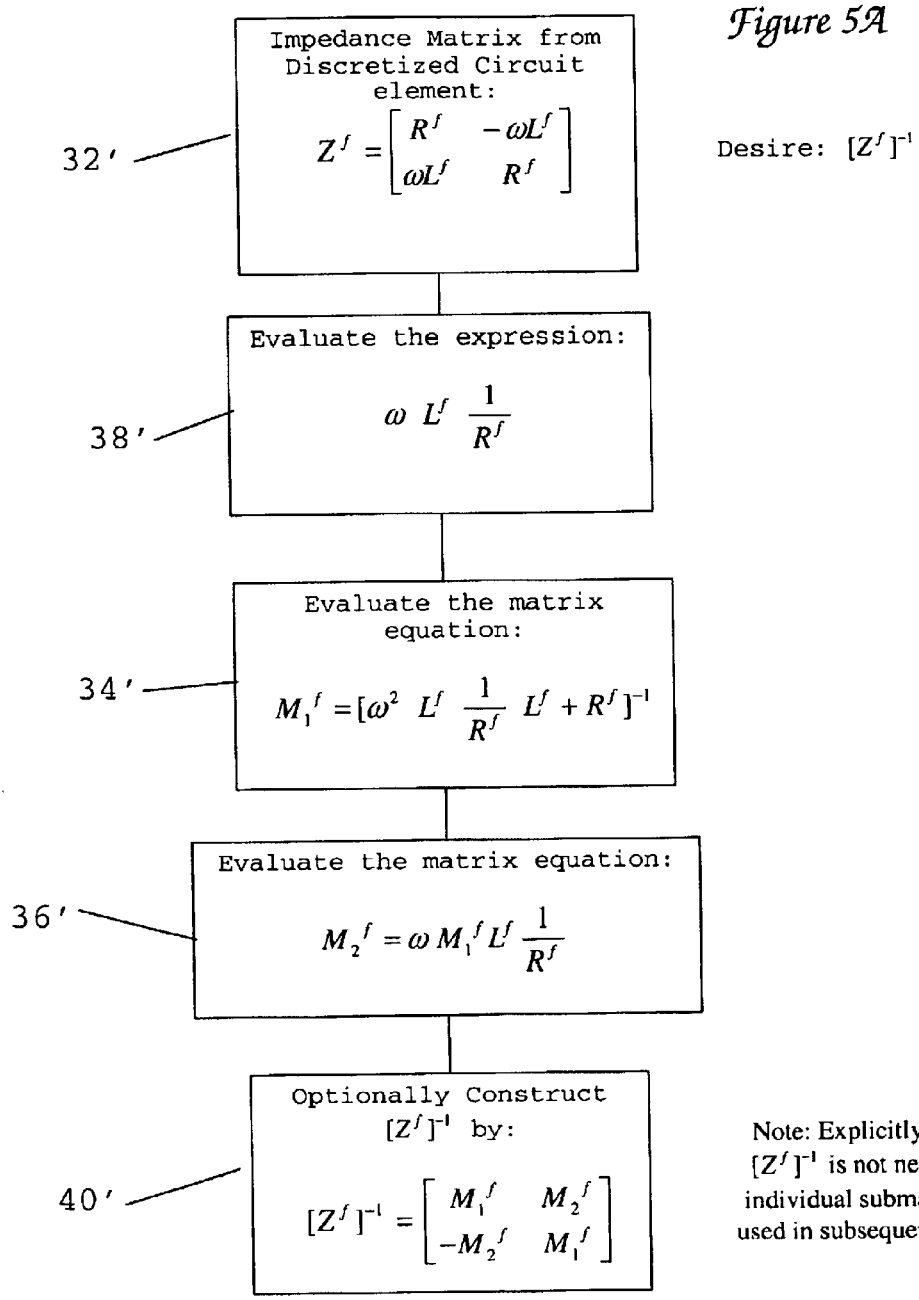
FIG. 5A shows an alternate embodiment of the invention for inverting an impedance matrix.

Embodiments of the invention herein have been described and illustrated using matrices and matrix operations with a specific order of matrix operations (e.g. matrix multiplication). Applicants note that the order in which some of the matrix multiplications are performed may be changed and still be within the spirit and scope of the invention. One such alternate embodiment of the invention herein is shown in FIG. 5A. Step 36' of FIG. 5a and step 36 of FIG. 5 show different orders of multiplying submatrices $$M_1^f,\ L^f,\ \text{and}\ \frac{1}{R^f}.$$

Changing the order of these terms in steps 36 & 36' (and also in step 38, 38') yields the same results for the model.

Similarly, carrying "minus signs" throughout the calculations that cancel in the final result is simply a trivially different way to describe the same method. For example, in the applicant's strict application of Strassen's Method, minus signs appear in the expression for $K_5$. Yet the formulation as shown in FIGS. 5 and 5A do not show any minus signs in step 34. The applicant recognized that the minus signs were extraneous for this particular problem. Whether a) "minus signs" are carried and then canceled, or b) dropped along the way as is understood in the art, either method yields the same result as long as it is consistently applied.

Further, applicant could have used a different convention and defined $Z^f$ as follows:

$$Z^f = \begin{bmatrix} R^f & \omega L^f \\ -\omega L^f & R^f \end{bmatrix}.$$

Though this matrix equation has its own set of solution steps, these are essentially solving the same problem in the same way. The differences being in the "minus signs", with the approaches being the same.

It should be noted that in order to find the inverse of a matrix, it is not necessary to explicitly and completely construct the matrix to be inverted per se. It is however convenient and trivial, but not necessary. In embodiments of the invention herein, it is easy to construct submatrices $\omega L$ and R without actually performing the added step of constructing the impedance matrix per se from these submatrices.

Similarly, at the other end of the calculations, it not necessary to explicitly and completely construct the inverted impedance matrix per se from the matrices M1 and M2. However, it is convenient and trivial, but not necessary. It is possible, when implementing embodiments of the invention in simulation code (software) to continue with subsequent calculations using only M1 and M2 without actually constructing the inverted impedance matrix per se. Applicant notes that a portion of the novelty of embodiments of the invention is in how M1 and M2 are calculated from $\omega L$ and R. Descriptions of starting with the initial impedance matrix or constructing the final inverted impedance matrix per se, are used to help explain the nature of this invention, and should not be used to limit the scope of this invention in any way. Embodiments of the invention may or may not include the initial impedance matrix and/or the final fully constructed inverted impedance matrix per se.

It should be understood that the herein described methods and modules, or portions thereof, may be implemented in whole or in part in various embodiments in a machine readable medium comprising machine readable instructions for causing a computer to perform the methods or effect the operation of the modules. The computer programs run on a central processing unit out of main memory, and may be transferred to main memory from permanent storage via disk drive or CD-ROM drive when stored on removable media or via a network connection or modem connection when stored outside of the computer, or via other types of computer or machine readable media from which it can be read and utilized.

Such machine readable media may include software modules and computer programs. The computer programs may comprise multiple modules or objects to perform the described methods or the functions of the various apparatuses. The type of computer programming languages used to write the code may vary between procedural code type languages to object oriented languages. The files or objects need not have a one to one correspondence to the modules or method steps described depending on the desires of the programmer. Further, the method and apparatus may comprise combinations of software, hardware and firmware as is well known to those skilled in the art.

We claim:

1. A method of modeling a circuit element comprising:
   a) discretizing said circuit element into at least one segment of a plurality of segments;
   b) dividing each segment of a plurality of segments into a plurality of filaments;
   c) providing an impedance matrix representative of said plurality of filaments, wherein said impedance matrix comprises:
      a first submatrix $a_{11}$=R;
      a second submatrix $a_{12}$=$-\omega$L;
      a third submatrix $a_{21}$=$\omega$L;
      a fourth submatrix $a_{22}$=R; and
      wherein R is a diagonal filament resistance matrix, L is a filament inductance matrix and $\omega$ is radian frequency;
   d) evaluating an equation M1=$[\omega^2 L(1/R)L+R]^{-1}$;
   e) evaluating a second matrix equation M2, wherein said matrix equation M2 comprises M1, L, 1/R, and $\omega$; and
   f) optionally constructing said inverse of an impedance matrix by setting
      a first submatrix of said inverse $c_{11}$=M1,
      a second submatrix of said inverse $c_{12}$=M2,
      a third submatrix of said inverse $c_{21}$=$-$M2,
      a fourth submatrix of said inverse $c_{22}$=M1.

2. The method of claim 1 wherein (b) further comprises defining a plane of symmetry such that a first group of filaments are positioned above said plane of symmetry and a second group filaments are positioned below said first plane of symmetry; and
   providing a plurality of filament pairs, wherein each of said plurality of filament pairs comprises one filament in said first group of filaments and one filament in said second group of filaments.

3. The method of claim 2 wherein said plane of symmetry is oriented horizontally.

4. The method of claim 1 wherein (b) further comprises defining at least one of said plurality of filaments as having a cross-sectional area greater than remaining filaments within a same said segment.

5. The method of claim 1 further comprising:

selecting or defining an equivalent circuit model representative of at least one of said plurality of filaments before performing (c); and wherein (c) further comprises providing said impedance matrix that is representative of said equivalent circuit model and said plurality of filaments.

6. A computer-readable medium containing code for modeling a circuit element the code performing;

a) aiding an operator in discretizing said circuit element into at least one segment of a plurality of segments;

b) aiding an operator in dividing each segment of a plurality of segments into a plurality of filaments;

c) providing an impedance matrix representative of said plurality of filaments, wherein said impedance matrix comprises:

a first submatrix $a_{11}=R$;
a second submatrix $a_{12}=-\omega L$;
a third submatrix $a_{21}=\omega L$;
a fourth submatrix $a_{22}=R$; and
wherein R is a diagonal filament resistance matrix, L is a filament inductance matrix and $\omega$ is radian frequency;

d) evaluating an equation $M1=[\omega^2 L(1/R)L+R]^{-1}$;

e) evaluating a second matrix equation M2, wherein said matrix equation M2 comprises M1, L, 1/R, and $\omega$; and f) optionally constructing an inverse of said impedance matrix by setting
a first submatrix of said inverse $c_{11}=M1$,
a second submatrix of said inverse $c_{12}=M2$,
a third submatrix of said inverse $c_{21}=-M2$,
a fourth submatrix of said inverse $c_{22}=M1$.

7. The computer-readable medium containing code of claim 6 wherein (b) further comprises aiding an operator in defining a plane of symmetry such that a first group of filaments are positioned above said plane of symmetry and a second group filaments are positioned below said first plane of symmetry; and providing a plurality of filament pairs, wherein each of said plurality of filament pairs comprises one filament in said first group of filaments and one filament in said second group of filaments.

8. The method of claim 7 wherein said plane of symmetry is oriented horizontally.

9. The computer-readable medium containing code of claim 6 wherein (b) further comprises aiding an operator in defining at least one of said plurality of filaments as having a cross-sectional area greater than remaining filaments within a same said segment.

10. A system for modeling an inductive circuit element said system comprising:

software code;

a computer having a CPU for executing said software code;

memory for storing said software code and for storing results of calculations performed by said software code;

an interface operative to 1) present information to an operator and 2) allow said operator to enter data into the system; and wherein said software code comprises a first portion operative to determine elements of an inverted matrix by:

evaluating a first matrix equation $M1=[\omega^2 L(1/R)L+R]^{-1}$;

evaluating a second matrix equation M2, wherein said matrix equation M2 comprises M1, L, 1/R, and $\omega$;

constructing a second matrix by setting
a first submatrix $c_{11}=M1$,
a second submatrix $c_{12}=M2$,
a third submatrix $c_{21}=-M2$,
a fourth submatrix $c_{22}=M1$; and
wherein R is a diagonal filament resistance matrix, L is a filament inductance matrix, $\omega$ is radian frequency and $[\ ]^{-1}$ is matrix inversion.

11. The system of claim 10 wherein said software code further comprises a second portion operative to aid an operator in discretizing said inductive circuit element into at least one segment.

12. The system of claim 11 wherein said software code further comprises a third portion operative to aid an operator in dividing each of said at least one segments into a plurality of filaments.

13. The system of claim 12 wherein said software code further comprises a fourth portion operative to aid an operator in defining a horizontal plane of symmetry about said inductive circuit element such that a first group of filaments are positioned above said plane of symmetry and a second group of filaments are positioned below said first plane of symmetry; and providing a plurality of filament pairs, wherein each of said plurality of filament pairs comprises one filament in said first group of filaments and one filament in said second group of filaments.

14. The system of claim 13 wherein said software code further comprises a fifth portion operative to aid an operator in defining at least one of said plurality of filaments as having a cross-sectional area greater than remaining filaments within a same said segment.

* * * * *